United States Patent [19]

Amano

[11] Patent Number: 5,289,038
[45] Date of Patent: Feb. 22, 1994

[54] BUMP ELECTRODE STRUCTURE AND SEMICONDUCTOR CHIP HAVING THE SAME

[75] Inventor: Akira Amano, Kawasaki, Japan

[73] Assignee: Fuji Electric Co., Ltd., Kanagawa, Japan

[21] Appl. No.: 967,400

[22] Filed: Oct. 28, 1992

[30] Foreign Application Priority Data

Oct. 30, 1991 [JP] Japan .................. 3-283367

[51] Int. Cl.⁵ ............ H01L 29/06; H01L 23/48; H01L 29/46; H01L 29/62
[52] U.S. Cl. .................. 257/780; 257/781
[58] Field of Search ........... 257/778, 779, 780, 784, 257/737, 738, 397, 513, 624, 622, 781

[56] References Cited

U.S. PATENT DOCUMENTS 3,577,037 5/1971 DiPietro ........................ 257/777
3,839,727 10/1974 Herdzik et al. .
4,074,342 2/1978 Honn et al. ................... 257/747
4,163,988 8/1979 Yeh et al. .

FOREIGN PATENT DOCUMENTS 0111823 6/1984 European Pat. Off. .

Primary Examiner—Sheila V. Clark
Attorney, Agent, or Firm—Spencer, Frank & Schneider

[57] ABSTRACT

A concave portion having a V-shaped cross section is dug in a semiconductor region of a chip, and a surface of the semiconductor region inclusive of the concave portion is covered with an insulation film. A wiring film connected to an integrated circuit device is disposed on the insulation film. A protection film covering the surface of the chip is provided with a window to expose the concave portion and a portion of the wiring film. The window is covered with a thin metal subbing film connected to the wiring film. A metal protrusion for a bump electrode is provided by an electroplating process so as to protrude from the concave portion.

10 Claims, 3 Drawing Sheets

BUMP ELECTRODE STRUCTURE AND SEMICONDUCTOR CHIP HAVING THE SAME

BACKGROUND OF THE INVENTION

1. Field of the Invention

The present invention relates to a bump electrode structure and more particularly to a small bump electrode or protruded electrode provided on a semiconductor chip for connecting the integrated circuit device to the outside. The present invention also relates to a semiconductor chip having such a bump electrode structure.

2. Description of the Prior Art

Recent development of high integration techniques for fabricating semiconductor integrated circuit devices has naturally led to requirement for rationalization of forms in which the semiconductor integrated circuit devices are-mounted in electronic circuits or electronic devices, particularly reduction in time and effort, as well as spaces required for mounting. As is well known, it is more advantageous to mount chips of integrated circuit devices as they are, i.e., in the form of chips themselves, than mount them after they are contained in plastic packages or the like. Hence, so-called flip chips, which are mass-produced electronic devices having protruding bump electrodes have been adopted widely.

Referring to FIG. 1, a typical example of construction of a conventional bump electrode will be explained below. FIG. 1 is a cross sectional view showing a portion of a semiconductor integrated circuit device chip. As shown in FIG. 1, a bump electrode 20 made of a solder is mounted on a semiconductor region 10 of a semiconductor integrated circuit device chip 1. An insulator film 22 such as silica film covers a surface of the semiconductor region 10. An aluminum wiring 23 connected to the integrated circuit in the semiconductor region 10 is arranged on the insulation film 22. An end of the aluminum wiring 23 is covered with a protective film 24 made of silicon nitride or the like, which is formed with a window for forming the bump electrode 20 by removing the protective film 24 to expose the aluminum film 23. The exposed aluminum film area or the window area is covered with a thin subbing layer 25 made of a metal such as titanium or copper. Then, a metal protrusion 26 made of a solder is grown to a predetermined height by an electroplating method. In the case shown in FIG. 1, the metal protrusion 26 is heated for a short time to melt the solder, thereby forming the bump electrode 20 rounded on its top.

The mounting of a flip chip having such a bump electrode as mentioned above can be performed, for example, by placing the chip on a device on which the chip is to be mounted in such a manner that the tip of the bump electrode contacts a conductor of the other device, that is, upside down in FIG. 1, and heating in this state to melt the solder to thereby solder the metal protrusion 26 to the conductor. This ensures both fixation and connection of the flip chip to the other device on which it is to be mounted simultaneously, resulting in reduction in the labor of mounting and minimization of spaces required for the mounting.

The development of high integration of circuits on the other hand has led to reduction in size of chips of semiconductor integrated circuit devices and increase in the number of circuits integrated in a single chip, and hence there is a tendency that the number of connections connected to the outside increases. In the case of certain integrated circuit devices, for example, it is required to arrange several hundreds bump electrodes on a surface of a chip of within several millimeter square. This means the size of the bump electrode must be reduced from about 100 $\mu$m in diameter or square as had by conventional bump electrodes, to below 30 $\mu$m. However, miniaturization or reduction in size causes a new problem of weakened attachment or junction of the bump electrodes to the root of the chip More specifically, reduction in the diameter of a bump electrode from 100 $\mu$m to 30 $\mu$m results in reduction in the area of the root portion the bump electrode to about 1/10, and this alone leads to reduction in junction strength by one order of magnitude. In addition, reliability of adhesion among the films provided between the metal protrusion 26 and the semiconductor region 10, i.e., the insulation film 22, aluminum wiring film 23, the protection film 24 and the subbing film 25 shown in FIG. 1 also reduces so that decrease in the junction strength is further aggravated to such an extent that a small outer force urged upon the mounting could readily cause the films to peel one from another.

SUMMARY OF THE INVENTION

In view of the necessity of improvement of the strength of the root portions of bump electrodes for high integration of integrated circuit devices having a large number of external connections, it is an object of the present invention to increase the strength of attachment of bump electrodes to a semiconductor chip.

According to the first aspect of the present invention, there is provided a bump electrode structure for an integrated circuit device, comprising:

a semiconductor region having a surface and provided with a concave portion having a V-shaped cross section, the semiconductor region including an integrated circuit device having a surface;

an insulation film covering the surface of the semiconductor region inclusive of the concave portion;

a metal wiring film disposed on the insulation film and connected to the integrated circuit device;

a protection film covering the surface of the integrated circuit device and provided with a window in which only a predetermined region of the wiring film and the concave portion are exposed;

a thin metal subbing film covering the window of the protection film and connected to the wiring film; and a metal protrusion provided on the subbing film.

According to the second aspect of the present invention, there is provided a semiconductor integrate circuit device chip with a bump electrode, comprising:

a semiconductor chip having an integrated circuit device, the device having a surface;

a semiconductor region included in the semiconductor chip and having a surface, the semiconductor region being provided with a concave portion having a V-shaped cross section;

an insulation film covering the surface of the semiconductor region inclusive of the concave portion;

a metal wiring film disposed on the insulation film and connected to the integrated circuit device;

a protection film covering the surface of the integrated circuit device and provided with a window in which only a predetermined region of the wiring film and the concave portion are exposed;

a thin metal subbing film covering the window of the protection film and connected to the wiring film; and a metal protrusion provided on the subbing film.

In the bump electrode structure and the semiconductor chip of the present invention, the concave portion may have a depth which is the same as or larger than its opening width.

The metal protrusion may have a root width of 30 μm or less.

The subbing film may be composed of an upper subbing film and a lower subbing film.

The protection film may have another window and the bump electrode may comprise a connection pad extending from the wiring film and exposed within the another window in the protection film.

The wiring film may be provided with a window corresponding to the concave portion.

The above and other objects, effects, features and advantages of the present invention will become more apparent from the following description of embodiments thereof taken in conjunction with the accompanying drawings.

DETAILED DESCRIPTION OF THE INVENTION

The present invention is based on the discovery that the strength of attachment of the metal protrusion of a conventional bump electrode to a semiconductor region is based on the adhesion on the flat surfaces of films intervening the electrode and the semiconductor region and, hence, external force, especially one exerted in a lateral direction, gives rise to a peeling force to the flat adhesion surface, which causes the problem. By providing a metal protrusion on a concave portion formed in the semiconductor region and having a V-shaped profile as described above, when an external force is exerted on the metal protrusion in a lateral direction, not only a peeling force, but also a compression force are caused to be exerted between the bump electrode and the underlying film and between the films. By increasing the area of the adhesion surface or the surface on which the external force is exerted by the provision of the concave portion, the strength of the bump electrode at its root portion can be increased by one order of magnitude as compared with the conventional bump electrode.

That is, mainly the aforementioned compression force acts as a reaction to a rotational moment applied to the metal protrusion due to the lateral external force exerted on the protrusion and a reaction by the peeling force is only small. As a result, it is possible to sufficiently increase the strength against the peeling at the root portion of the bump electrode according to the present invention. While pressure in a vertical direction is exerted on the metal protrusion at the time of mounting the flip chip on an integrated circuit device, or the like, the bump electrode of the present invention is attached on a concave portion formed in the semiconductor region and has a wider area for receiving that pressure than the conventional bump electrode in that the strength of the root portion of the bump electrode of the present invention against a vertical external force is increased as compared with the bump electrode.

DESCRIPTION OF PREFERRED EMBODIMENTS

Figure 1:
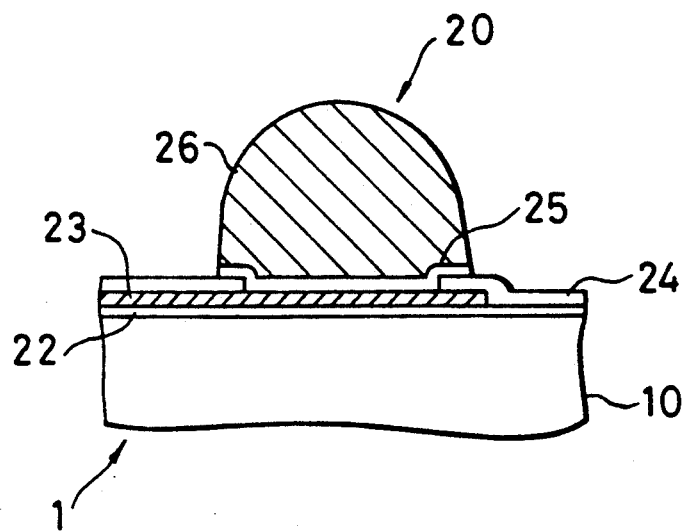
FIG. 1 is a cross sectional view showing a conventional bump electrode.
Figure 2:
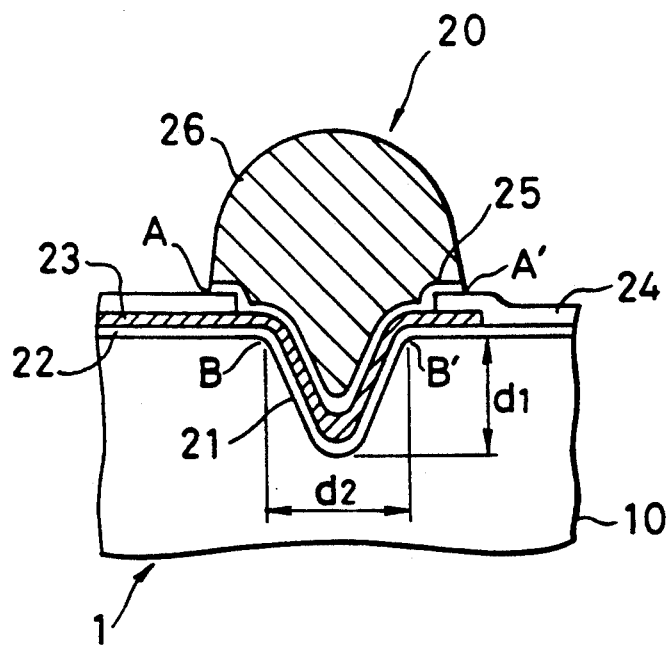
FIG. 2 is a cross sectional view showing a bump electrode in accordance with an embodiment of the present invention.
Figure 3A:
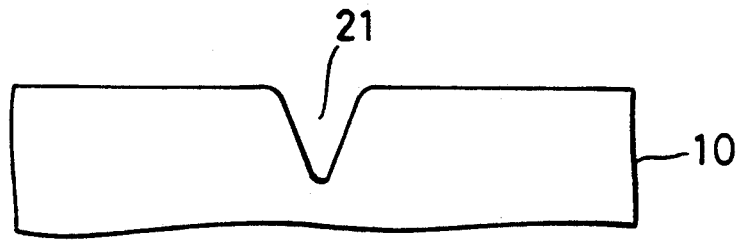
FIGS. 3A to 3D are cross sectional views illustrating a method for manufacturing a bump electrode in accordance with an embodiment of the present invention, FIG. 3A showing a state after the formation of a concave portion, FIG. 3B a state before a subbing film is deposited, FIG. 3C a state after a subbing film is deposited, and FIG. 3D a state after electroplating a metal protrusion.
Figure 4:
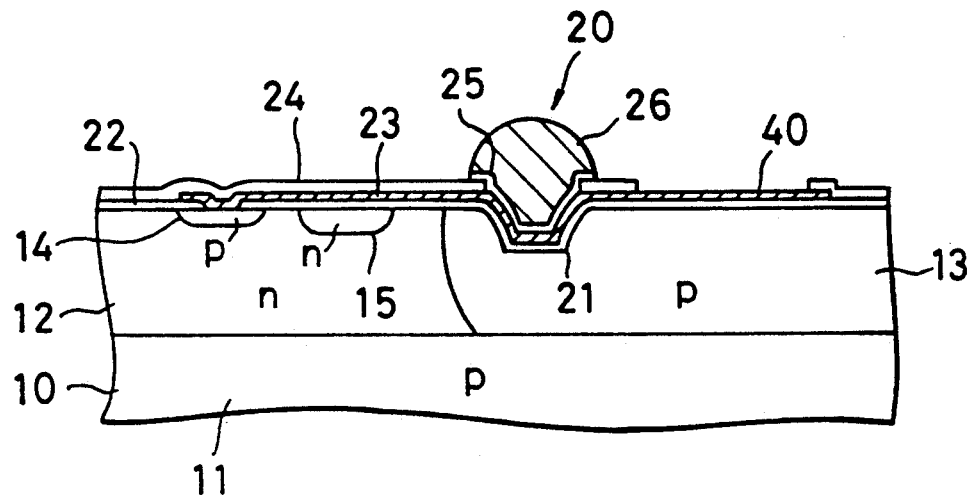
FIG. 4 is an enlarged cross sectional view of a main portion of a flip chip, illustrating application of the bump electrode shown in FIG. 2 to an integrated circuit device.
Figure 5:
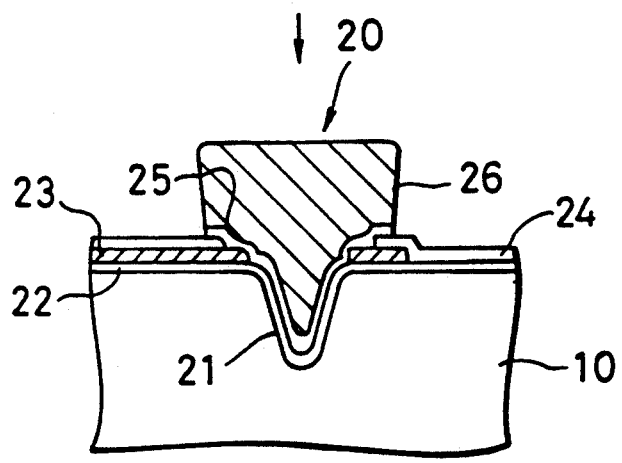
FIG. 5 is a cross sectional view showing a bump electrode in accordance with another embodiment of the present invention.

The invention will now be described in more detail with reference to the accompanying drawings. However, it should not be construed that the present invention is limited to the specific embodiments shown in the drawing. FIG. 2 is a cross sectional view showing a bump electrode in accordance with an embodiment of the present invention; FIGS. 3A to 3D are cross sectional views illustrating a method for manufacturing a bump electrode in accordance with an embodiment of the present invention, FIG. 3A showing a state after the formation of a concave portion, FIG. 3B a state before a subbing film is deposited, FIG. 3C a state after a subbing film is deposited, and FIG. 3D a state after electroplating a metal protrusion; FIG. 4 is an enlarged cross sectional view of a main portion of a flip chip, illustrating application of the bump electrode shown in FIG. 2 to an integrated circuit device; and FIG. 5 is a cross sectional view showing a bump electrode in accordance with another embodiment of the present invention. The same or equivalent parts or members as those shown in FIG. 1 are indicated by same reference numerals and explanation thereof is omitted.

In the arrangement shown in FIG. 2, the metal protrusion for the bump electrode 20 is made of a solder. The size of the metal protrusion 26 is, for example, 25 to 30 μm in diameter or square at its root, and 20 to 25 μm in height. The bump electrode of the present invention differs from the conventional bump electrode shown in FIG. 1 in that the bump electrode of the invention has the concave portion 21 is formed in the semiconductor region 10 to have a V-shaped cross section and the metal protrusion 26 of the bump electrode 20 is formed thereon so that it protrudes from the surface of the semiconductor region to some extent as shown in FIG. 2. The concave portion 21 has an opening whose area at the uppermost portion, i.e., the area of imaginary surface on an imaginary horizontal plane passing points A and A' as shown in FIG. 2 may be at least 25% of the area of the metal protrusion 26 at its root portion, i.e., the area of imaginary surface on an imaginary horizontal plane passing points B and B' in FIG. 2. The depth, $d_1$, of the concave portion 21 may be the same as the diameter or width, $d_2$, of its opening or slightly larger than that. For example, in this embodiment, the opening has a diameter or width of 1 to 20 m, and a depth of 15 to 25 μm.

The construction of the bump electrode of the invention is the same as the conventional bump electrode excepting the presence of the concave portion 21 in the former. That is, the surface of the semiconductor region 10 inclusive of the surface of the concave 21 is covered with the insulation film 22, on which the metal wiring film 23 is arranged including a portion extending on the concave portion 21. Then, the protective film 24 is deposited on the metal wiring film 23, and one or more windows are opened to expose the wiring film 23 where one or more bump electrodes 20 are to be formed. Further, the thin metal subbing film 25 is arranged in the window or windows so that it can connect to the wiring film 23. On the subbing film 25 is provided the metal protrusion 26 made of a solder by electroplating.

Referring to FIGS. 3A to 3D, fabrication of the bump electrode 20 having the construction shown in FIG. 2 will be described below. FIG. 3A shows a state of the semiconductor region 10 after the formation of the concave portion 21 is formed. The digging or formation of the concave portion 21 can be performed advantageously by a plasma etching process or a reactive ion etching process. By such a process and using as the reaction gas, for example, a mixed gas composed of $CF_4$ and $SF_6$ containing oxygen with setting up the gas pressure and the plasma power under anisotropic conditions, the concave 21 can be formed having a steep inclination and an exact V-shaped side profile to a sufficient depth. The forming of the concave 21 is preferably done before integrated circuits can be fabricated in the semiconductor region 10.

Figure 3B:
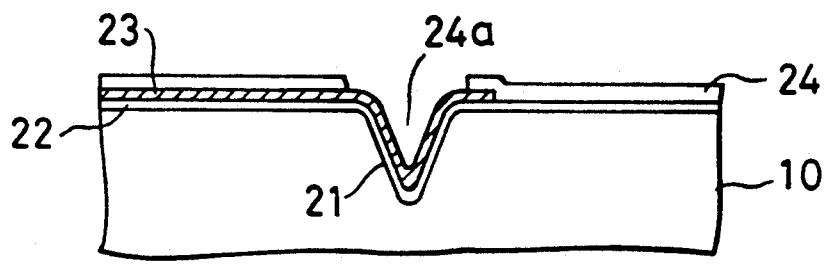
Figure 3C:
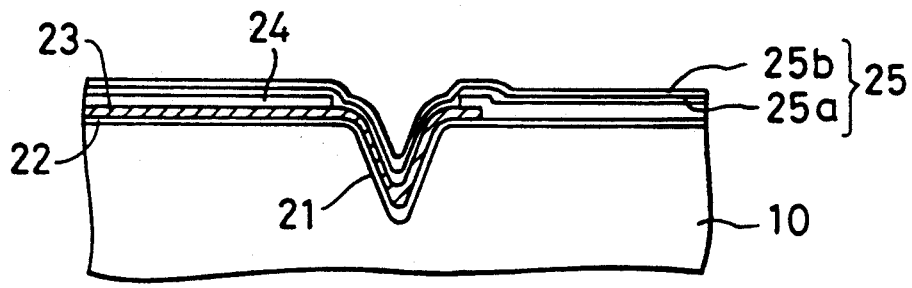
Figure 3D:
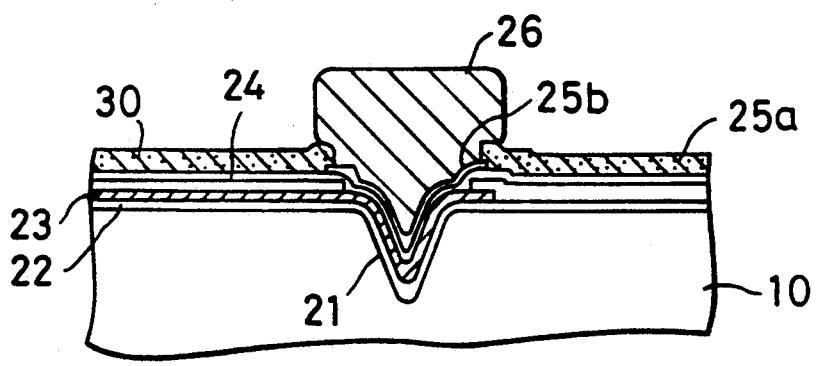

In FIG. 3B, usually the insulation film 22 made of silica is formed on the surface of the semiconductor region 10 to a thickness of, for example, 1 to 1.5 $\mu$m, and the wiring film 23 made of aluminum is formed on the surface of the film 22 to a thickness of 0.5 to 1.5 $\mu$m in a predetermined wiring pattern. Then, the protective film 24 made of silicon nitride or the like is formed to a thickness of 1 to 2 $\mu$m by a CVD process, and a window 24a is formed by a dry etching process to expose an end portion of the wiring film 23 including the concave portion 21 to obtain the arrangement shown in FIG. 3B. FIG. 3C shows a state of the semiconductor region 10 after the subbing film 25 is deposited on the whole surface. As usual, the subbing film 25 composed of two layers superimposed one on another. In this embodiment, the subbing film has a lower subbing film 25a made of a titanium film of 0.2 to 0.5 $\mu$m in thickness, and an upper subbing film 25b made of a copper film of 1 to 1.5 $\mu$m in thickness, both being formed by a sputtering process. FIG. 3D shows a state of the semiconductor region 10 after electroplating a metal protrusion thereon. First, the upper subbing film 25b is photoetched to form a pattern for providing the metal protrusion 26 to remove the upper subbing film 25b except the region corresponding to the window 24a. Then, a photoresist film 30 is provided on the upper subbing film 25b and the exposed lower subbing film 25a by a spin coating process. The photoresist film 30 is then photoetched at the region corresponding to the window 24a to expose the upper subbing layer 25b in the form of a window. Using the photoresist film 30 as a mask, the metal protrusion 26 is grown selectively on the exposed upper subbing film 25b as shown in FIG. 3D by an electroplating process with the lower subbing film 25a functioning as a negative electroplating electrode. Thereafter, the photoresist film 30 is removed. Also, the lower subbing film 25a is removed except where it is under the upper subbing film 25b. The metal protrusion 26 is heated for a short time as described hereinbefore to have the tip thereof rounded to obtain the state as shown in FIG. 2.

In the case of the bump electrode 20 having the construction shown in FIG. 2 provided on a flip chip of a semiconductor integrated circuit device, the strengths of the root portion of the electrode against external forces exerted on the electrode in both lateral and vertical directions are improved, even when the electrode is small in size by at least one order of magnitude as compared with the conventional bump electrode. Thus, troubles such as peeling or damage by pressure or impact which tend to act upon chips when they are transported or mounted can be reduced considerably. Furthermore, after the electroplating step illustrated in FIG. 3D, the residues of the etching of the lower subbing film 25a was removed by a jet flow of water at a pressure of 100 $Kg/cm^2$. As a result, despite a considerable pressure applied to the metal protrusion 26 laterally, no peeling of the bump electrode 20 occurred.

FIG. 4 is an enlarged cross sectional view of a main portion of a flip chip, illustrating application of the bump electrode shown in FIG. 2 to an integrated circuit device. In this application, the semiconductor region 10 of a wafer is composed of a p-type substrate 11 and an n-type epitaxial layer 12 grown on the substrate 11. On each periphery of the chip where the bump electrode 20 is to be provided is dispersed a p-type junction separation layer 13. On the surface portion of the epitaxial layer 12 are dispersed a p-type layer 14 and an n-type layer 15 for an integrated circuit as shown in FIG. 4. The wiring film 23 disposed on the insulation film 22 is connected to the p-type layer 14. The bump electrode 20 connected to the wiring film 23 has a narrow root width as small as about 30 $\mu$m as described with reference to FIG. 2 above so that it can be arranged at as small as possible a pitch back and forth in FIG. 4. In this application, in order to increase its current-carrying capacitance, the bump electrode 20 has a larger root width, for example 60 $\mu$m, from side to side in FIG. 4. Accordingly, the concave portion 21 is dug to have a V-shaped, slightly oblong rectangular cross section.

The integrated circuit device is tested as usual after the wafer processing is over. When the bump electrode 20 is miniaturized to have a diameter of below 50 $\mu$m, it becomes difficult to contact a needle of a probe for the test with the bump electrode 20. To cope with this, a connection pad 40 is provided in the application shown in FIG. 4. The connection pad 40 is formed to an 80 $\mu$m square, which is considerably larger than the size of the bump electrode, for example, by making the use of a so-called scribe zone for scribing upon isolation of chips from the wafer. For this purpose, an end of the wiring film 23 is extended and exposed in a window formed in the protection film 24. Thus, the connection pad 40 is formed.

FIG. 5 is a cross sectional view showing a bump electrode in accordance with another embodiment of the present invention in which the bump electrode 20, whose metal protrusion is made of gold or copper and which has a lower current-carrying capacitance, is miniaturized more than the electrode shown in FIG. 2. When the root width of the bump electrode 20 is about 20 $\mu$m, for example, then the opening width of the concave portion 21 is 10 to 15 $\mu$m. Hence, in the arrangement shown in FIG. 5, the wiring film 23 in the concave portion 21 is omitted but only provided the periphery of concave portions. The subbing film 25 is disposed to connect to the wiring film 23 and also in the concave portion 21. On the subbing film 25, is grown gold or copper for the metal protrusion 26 is grown by an electroplating process. As a result, the metal protrusion is well anchored within the concave 21, thus giving the semiconductor region 10 a high attachment strength. In the embodiment shown in FIG. 5, the upper subbing film 25b (See FIG. 3D) within the region of the concave 21 may be made of palladium or the like and may have a film thickness of about 0.4 to about 0.6 μm, which is slightly smaller than the counterpart structure shown in FIG. 2. The arrangement shown in FIG. 5 is advantageous in the case where the bump electrode 20 is of a size below about 20 μm.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A bump electrode structure for an integrated circuit device, comprising:
   a semiconductor region having a surface and provided with a concave portion having a V-shaped cross section, said semiconductor region including an integrated circuit device having a surface;
   an insulation film covering the surface of said semiconductor region inclusive of said concave portion;
   a metal wiring film disposed on said insulation film and connected to said integrated circuit device;
   a protection film covering said surface of said integrated circuit device and provided with a window in which only a predetermined region of said wiring film and said concave portion are exposed;
   a thin metal subbing film covering said window of said protection film and connected to said wiring film; and
   a metal protrusion having a root width of 30 μm or less provided on said subbing film.

2. The bump electrode structure as claimed in claim 1, wherein said concave portion has a depth which is the same as or larger than its opening width.

3. The bump electrode structure as claimed in claim 1, wherein said subbing film is composed of an upper subbing film and a lower subbing film.

4. The bump electrode structure as claimed in claim 1, wherein said protection film has another window and wherein said bump electrode comprises a connection pad extending from said wiring film and exposed within said another window in said protection film.

5. The bump electrode structure as claimed in claim 1, wherein said wiring film is provided with a window corresponding to said concave portion.

6. A semiconductor integrated circuit device chip with a bump electrode, comprising:
   a semiconductor chip having an integrated circuit device, said device having a surface;
   a semiconductor region included in said semiconductor chip and having a surface, said semiconductor region being provided with a concave portion having a V-shaped cross section;
   an insulation film covering the surface of said semiconductor region inclusive of said concave portion;
   a metal wiring film disposed on said insulation film and connected to said integrated circuit device;
   a protection film covering said surface of said integrated circuit device and provided with a window in which only a predetermined region of said wiring film and said concave portion are exposed;
   a thin metal subbing film covering said window of said protection film and connected to said wiring film; and
   a metal protrusion having a root width of 30 μm or less provided on said subbing film.

7. The semiconductor chip as claimed in claim 6, wherein said concave portion has a depth which is the same as or larger than its opening width.

8. The semiconductor chip as claimed in claim 6, wherein said subbing film is composed of an upper subbing film and a lower subbing film.

9. The semiconductor chip as claimed in claim 6, wherein said protection film has another window and wherein said bump electrode comprises a connection pad extending from said wiring film and exposed within said another window in said protection film.

10. The semiconductor chip as claimed in claim 6, wherein said wiring film is provided with a window corresponding to said concave portion.

* * * * *